United States Patent [19]

Mirow

[11] Patent Number: 5,459,438
[45] Date of Patent: Oct. 17, 1995

[54] NEGATIVE FEEDBACK FREQUENCY STABILIZED PULSE OSCILLATOR

[76] Inventor: Fred Mirow, 118 Cornell Rd., Bala Cynwyd, Pa. 19004-2146

[21] Appl. No.: 991,249

[22] Filed: Dec. 16, 1992

[51] Int. Cl.$^6$ .................... H03K 3/64; H03B 5/20
[52] U.S. Cl. .................... 331/137; 331/135; 331/175; 331/143; 331/111; 331/108 B; 331/DIG. 3
[58] Field of Search .................... 331/108 B, 109, 331/110, 115, 132, 135, 136, 137, 138, 141, 175, 176, 179, 183, DIG. 3, 143, 140, 111, 57; 330/109; 307/591, 594, 597, 602, 605; 327/262, 394, 392, 264

[56] References Cited

U.S. PATENT DOCUMENTS

| | | | |
|---|---|---|---|
| 2,173,427 | 9/1939 | Scott | 331/140 |
| 2,749,441 | 6/1956 | Kelly | 331/137 |
| 3,206,697 | 9/1965 | Martens | 331/141 |
| 3,514,717 | 5/1970 | Rose et al. | 331/141 |
| 3,548,831 | 12/1970 | McLean et al. | 331/137 X |
| 3,564,455 | 7/1971 | Wedel | 331/143 |
| 3,612,901 | 10/1971 | Loe | 331/137 X |
| 3,838,351 | 9/1974 | Hekimian | 330/104 |
| 4,987,389 | 1/1991 | Brosch et al. | 331/167 |

OTHER PUBLICATIONS

McGaughan & Leslie, "Resistance Tuned F.M. Oscillator for A.F." Proc. of the I.R.E., Waves and Electrons Section, vol. 35 pp. 974–978, Sep. 1947.

Primary Examiner—Robert J. Pascal
Assistant Examiner—Arnold Kinkead

[57] ABSTRACT

This invention relates to oscillators employing a primary feedback network and a high pass filter feedback network. The feedback networks are connected between the input and output of a of a high signal gain amplifier system. The primary feedback network provides positive feedback to cause oscillation to occur and also determines the nominal frequency of oscillation. The high pass filter feedback network provides a negative feedback signal that controls the rise and fall time of the amplifier system's output signal. By varying the output signal's rise and fall time the frequency of oscillation is also changed. The high signal gain amplifier system operates with one or more amplifier stages in the non-linear region to produce a significantly distorted sine wave or pulse output signal. The variation of the frequency of oscillation with the power supply voltage variation is reduced by using the high pass filter feedback network to vary the frequency of oscillation in a opposite direction to the variations in the nominal oscillator frequency which is controlled by the primary feedback network. In addition the high frequency negative feedback can frequency stabilize the oscillator system against temperature variations when the oscillator's amplifier system uses Field Effect Transistor active elements.

6 Claims, 2 Drawing Sheets

NEGATIVE FEEDBACK FREQUENCY STABILIZED PULSE OSCILLATOR

SUMMARY OF THE INVENTION

The object of this invention is an oscillator system in which the frequency stability is increased by the use of high frequency negative feedback. The negative feedback controls the rise and fall time of the amplifier's output signal. By varying the output signal's rise and fall time the frequency of oscillation is also changed. The negative feedback is used to cancel the effects of the oscillator system's power supply voltage level changes. The voltage level change causes the oscillator's amplifier system's gain and phase levels to change. The amplifier systems's parameter changes are the main cause of the oscillator frequency change. The oscillator system's feedback networks consist of passive components that are very stable in comparison to the amplifier system's active elements. In addition the high frequency negative feedback can frequency stabilize the oscillator system against temperature variations when the oscillator's amplifier system uses Field Effect Transistor active elements.

The advantage of this approach is that only a few additional resistors and capacitors are added to the circuit to form the high frequency negative feedback path. This maintains the total number of circuit parts required at a small number and in addition the oscillator circuit construction is compatible with the normal integrated circuit fabrication techniques.

BRIEF DESCRIPTION OF THE DRAWINGS

The invention will be described in detail hereinafter with reference to the accompanying drawings; in which.

DETAILED DESCRIPTION

Figure 1:
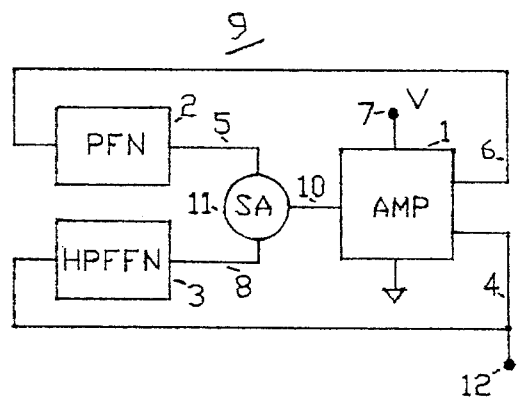
FIG. 1 is a schematic representation of the circuit of the present invention.
Figure 2:
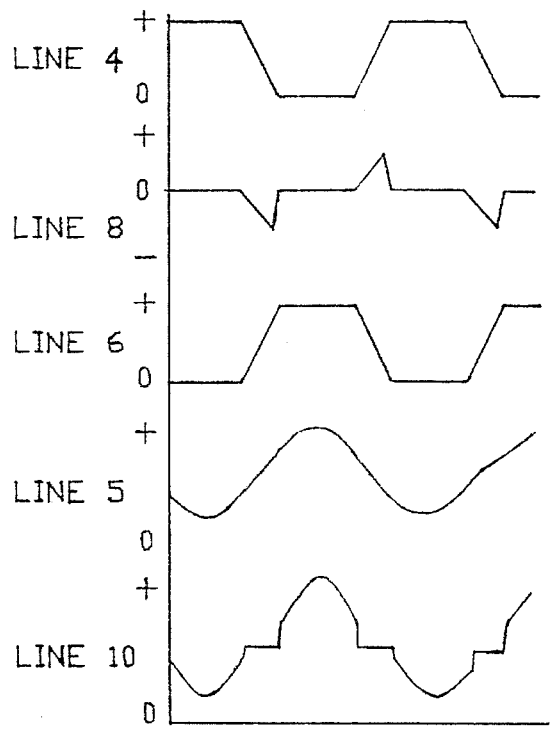
FIG. 2 is a diagram illustrating various system signal wave forms.

Referring to FIG. 1 and 2, the oscillator system 9 consist of high gain amplifier system 1, primary feedback network 2 (pfn), high pass filter feedback network 3 (hpffn) and signal adder 11. Signal adder 11 (sa 11) is a 0 phase shift passive network that combines the signals on lines 5 and 8 together placing the combined signals on line 10. Pfn 2 is a phase shift network that provides a positive feedback signal path between the amplifier system 1 output on line 6 and input of amplifier system 1 applied on line 10 through sa 11. The phase shift of pfn 2 and gain of amplifier system 1 are set to levels to cause oscillation to occur at a desired frequency. The output of pfn 2 on line 5 is a distorted sine wave (FIG. 2D). FIG. 2D represents the signal phase for the condition of Amplifier system 1 having 0 degrees phase shift between line 10 and line 6. Amplifier system 1 consist of one or more gain stages and has a gain sufficiently high to cause one or more of the amplifier stages to operate non-linear (driven substantially completely on or off). The oscillation caused by the positive feedback of pfn 2 is amplified by the high gain of amplifier system i causing the output signal on lines 4 and 6 to be a pulse train (FIG. 2A and 2C). Hpffn 3 provides a negative feedback signal path between amplifier system 1 input on line 10 and output on line 4. The negative feedback is used to control the rise and fall time of the amplifier system 1 output signal. The output of the hpffn 3 on line 8 (FIG. 2B) is a pulse that is proportional to the amplitude of the amplifier system 1 output signal level and has a pulse width about the same as the rise or fall time of the amplifier system 1 output signal. FIG. 2B represents the signal phase for the condition of Amplifier system 1 having 180 degrees phase shift between line 10 and line 4, and FIG. 2E represents the output signal of sa 11 on line 10. The signal output of oscillator system 9 is taken from terminal 12.

The normal operation of the oscillator system 9 is that during the output signal rise and fall times negative feedback is applied by hpffn 3 to the amplifier system 1 causing the output signal rise and fall times to be longer than if no negative feedback was applied. By changing the duration of the output signal rise and fall times the frequency of oscillation is varied. Increasing the rise and fall time decreases the frequency of oscillation. The variation of the power supply voltage level applied to terminal 7 causes the phase shift and gain of amplifier system 1 to also vary. These changes in amplifier system 1 causes the frequency of oscillation, and also the rise and fall times and amplitude of the output signal on lines 4 and 6 to also change. Using negative feedback applied through hpffn 3, the changes in pulse amplitude and rise and fall times are applied to the input of amplifier system 1 to change the frequency of oscillation back to its nominal value. By varying the duration of the rise and fall time the frequency of operation can be maintained constant as the power supply voltage varies. Also in some amplifier technologies, such as Field Effect Transistors, the effect of temperature change and supply voltage change on the amplifier are similar. This allows the variation in oscillator frequency with temperature to be reduced by using the negative feedback of hpffn 3 as previously described.

Figure 3:
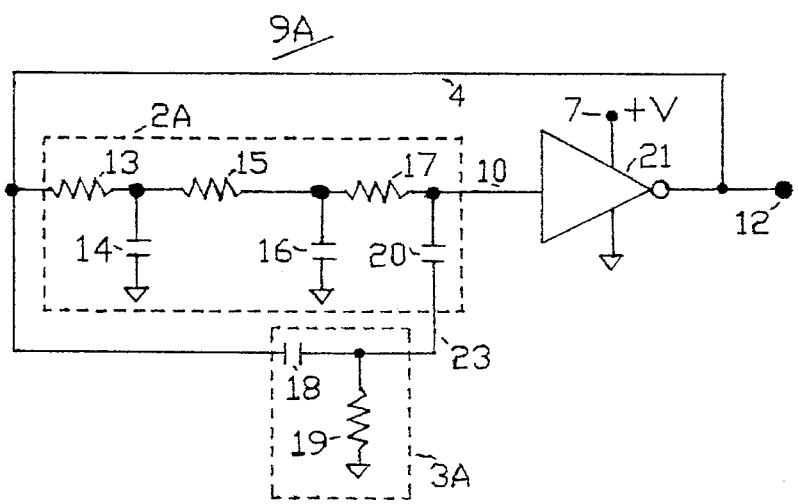
FIG. 3 is a detailed embodiment of oscillator system 9.

Referring now to FIG. 3 a practical means of implementing oscillator system 9 is shown. Oscillator system 9A uses resistor capacitor feedback networks. Amplifier 21 output signal on line 4 is applied to the input of pfn 2A, and hpffn 3A. The pfn 2A is a low pass ladder network consisting of resistors 13, 15, 17 and capacitors 14, 16, 20. Amplifier 21 has a phase shift of about 180 degrees and the ladder network of pfn 2A provides the remaining phase shift necessary to make the total phase shift at the frequency of oscillation 360 degrees. At high oscillation frequencies, amplifier 21 has a phase shift greater than 180 degrees and requires less than 180 degrees phase shift from pfn 2A. At these high frequencies the additional phase shift provided by pfn 2A resistor 15 and capacitor 16 are not needed and pfn 2C (FIG. 4) can be used. The hpffn 3A consist of capacitor 18, and resistor 19. The output of hpffn 3A on line 23 is coupled into the input of amplifier 21 through capacitor 20. The component values of hpffn 3A and pfn 2A or pfn 2C are such that the networks have small effect on each other. At the frequency of oscillation the impedance of resistor 19 is small in comparison to that of capacitor 20 resulting in resistor 19 having small effect on the operation of the ladder network. The capacitance value of capacitor 20 at high frequencies is large enough that the pulse output of hpffn 3A is not distorted. The combined output signals of the pfn 2A and hpffn 3A on line 10 are applied to amplifier 21 input. Amplifier 21 is a single input high gain inverting amplifier. The gain of amplifier 21 is high enough that one or more of the amplifier stages operate non-linear (driven substantially completely on or off) causing the output signal on line 4 to be a pulse train.

Figure 8:
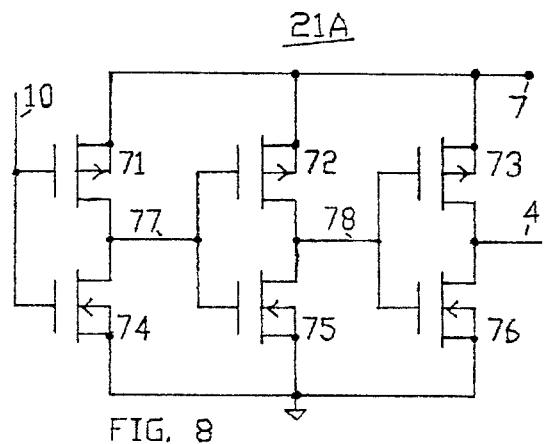
FIG. 8 is a schematic representation of Amplifier 21.

Referring now to FIG. 8 a practical means of implementing amplifier 21 is shown. The amplifier 21A uses CMOS type Field Effect Transistors and is well known by those skilled in the art. Transistors 71 through 73 are PMOS and 74 through 76 are NMOS. The PMOS and NMOS transistors exhibit essentially identical, but complemented characteristics. The signal on line 10 is placed on the gates of transistors 71 and 74. The amplified and inverted output signal on line 77 is connected to the next stage's input, the gates of transistor 72 and 75. The amplified and inverted output signal on line 78 is connected to the next stage's input, the gates of transistor 73 and 76. The amplified and inverted output signal of this stage is on line 4. The voltage to power each amplifier stage is supplied by terminal 7.

Figure 4:
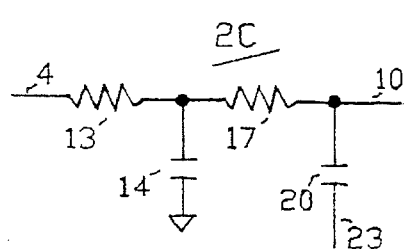
FIG. 4 is a schematic representation of an alternate embodiment of PFN 2.
Figure 5:
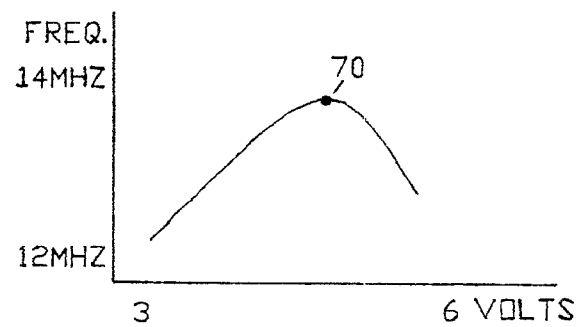
FIG. 5 is a diagram illustrating the variation of the oscillator system frequency verses power supply voltage for a particular example circuit.

As an illustrative example, a particular oscillator system constructed in accordance with the circuit of drawings of FIG. 3 and FIG. 4 is provided with component resistors and capacitors having substantially the following values;

Amplifier 21 is one gate of Harris CMOS I.C. CD74HC04E resistors 13, and 17 are both 360 ohms capacitors 14, 16, and 20 are each 47 pico farad resistor 19 is 43 ohms The oscillator frequency verses supply voltage for the oscillator system constructed from the above example parts is shown in FIG. 5. Amplifier 21 is a CMOS amplifier that has a reduction in the rate of gain change and phase change as the power supply voltage increases. When the power supply voltage range is in between 3 and approximately 5 volts, the amplifier gain and phase shift change is larger than the hpffn 3A can compensate for causing the oscillation frequency to increase as the power supply voltage increases. When the power supply voltage increases past approximately 5 volts, hpffn 3A starts to over compensate as the amplifier gain and phase shift change rate continues to decrease, causing the oscillation frequency to decrease. The location of the preferred operating voltage for the example oscillator system, at approximately 5 volts (FIG. 5 point 70), is where the slope of the curve changes from positive to negative. Operating the oscillator in the vicinity of point 70 results in reduced frequency change as the power supply voltage level changes. The sensitivity to temperature change on the oscillation frequency is also reduced near this voltage level.

Figure 6:
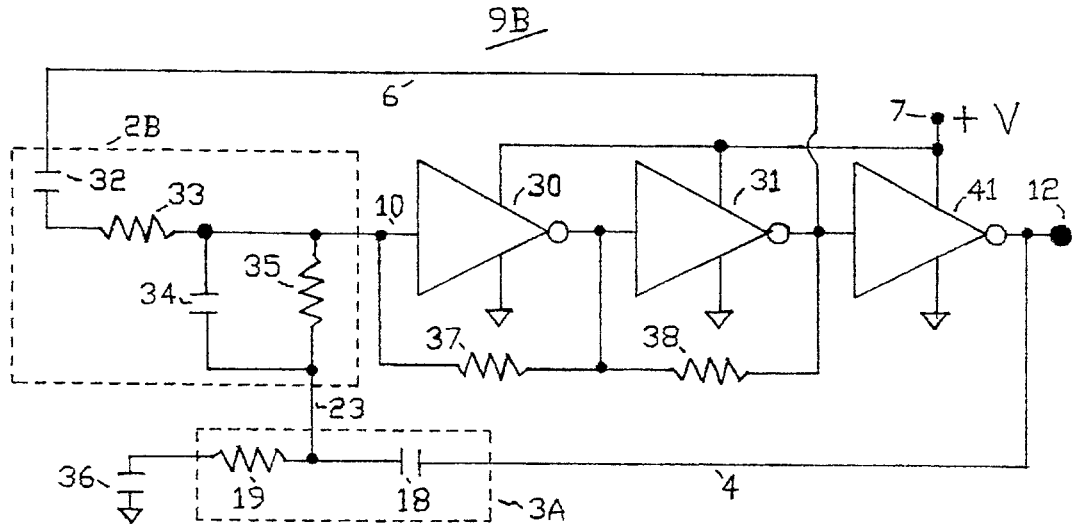
FIG. 6 is another detailed embodiment of oscillator system 9.

Referring now to FIG. 6, there is shown another alternate embodiment of oscillator system 9. Oscillator system 9B uses three inverting amplifiers 30, 31, and 41. Amplifier 31 output on line 6 is applied to the input of pfn 2B. Pfn 2B is the well known half Wien bridge network consisting of resistors 33 and 35, and capacitors 32 and 34. Between amplifier 30 input and 31 output there is a phase shift of about 360 degrees and the network of pfn 2B provides the remaining phase shift necessary to make the total phase shift at the frequency of oscillation 360 degrees. The hpffn 3A consist of capacitor 18, and resistor 19. The output of hpffn 3A on line 23 is coupled into the input of amplifier 30 through capacitor 34. The component values of hpffn 3A and pfn 2B are such that the networks have small effect on each other. At the frequency of oscillation the impedance of resistor 19 is small in comparison to that of capacitor 34 or resistor 35 resulting in resistor 19 having small effect on the operation of the half Wien bridge network. The capacitance value of capacitor 34 at high frequencies is large enough that the pulse output of hpffn 3A is not distorted. The combined output signals of the pfn 2B and hpffn 3A on line 10 are applied to amplifier 30 input. The gain of amplifier 30, 31 and 41 are high enough that one or more of the amplifier stages operate non-linear (driven substantially completely on or off) causing the output signal on lines 4 and 6 to be pulse trains. Resistors 37 and 38 along with capacitor 36 are used to obtain the correct DC bias voltage conditions for amplifier 37, 38, and 41 to operate and have appreciably no effect on the AC signal voltages. Resistors 37 and 38 have a high resistance value compared to AC impedance levels at the locations they are connected to and capacitor 36 has very low AC impedance compared to resistor 19.

Figure 7:
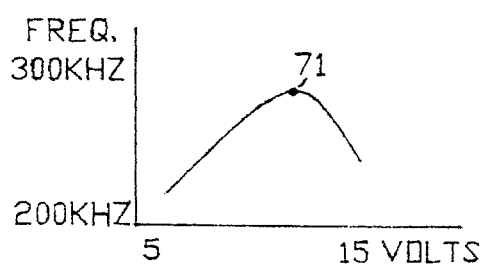
FIG. 7 is a diagram illustrating the variation of the oscillator system frequency verses power supply voltage for another particular example circuit.

As an illustrative example, a particular oscillator system constructed in accordance with the circuit of drawings of FIG. 6 is provided with component resistors and capacitors having substantially the following values;

Amplifier 30,31, and 41 are individual gates of RCA CMOS I.C. CD4069UBE resistor 33 is 1800 ohms resistor 35 is 320 ohms capacitor 32 is 180 pico farad capacitor 34 is 1000 pico farad resistor 19 is 43 ohms capacitor 18 is 470 pico farad capacitor 36 is 4.7 micro farad resistor 37 is 20 kilo ohms resistor 38 is 120 kilo ohms The oscillator frequency verses supply voltage for the oscillator system constructed from the above example parts is shown in FIG. 7. Amplifier 30, 31 and 41 are CMOS amplifiers that have a reduction in the rate of gain change and phase change as the power supply voltage increases. When the power supply voltage range is in between 5 and approximately 10 volts, the amplifier gain and phase shift change is larger than the hpffn 3A can compensate for causing the oscillation frequency to increases as the power supply voltage increases. When the power supply voltage increases past approximately 10 volts, hpffn 3A starts to over compensate as the amplifier gain and phase shift change rate continues to decrease, causing the oscillation frequency to decrease. The location of the preferred operating voltage for the example oscillator system, at approximately 10 volts (FIG. 7 point 71), is where the slope of the curve changes from positive to negative. Operating the oscillator in the vicinity of point 71 results in reduced frequency change as the power supply voltage level changes.

Although the above description has been directed to preferred embodiments of the invention, it will be understood and appreciated by those skilled in the art that other variations and modifications may be made without departing from the spirit and full range of equivalents of the features and aspects set forth in the appended claims.

I claim:

1. A compensation circuit for reducing the effects of power supply voltage level change to an oscillator comprising:

non-linear amplifier means for providing a pulse train output frequency signal having an output rise and an output fall time;

positive feedback means for receiving a amplifier output signal and applying a positive feedback signal to said amplifier means in accordance with said amplifier output signal;

negative feedback means for receiving said pulse train output frequency signal and providing a negative feedback signal to said amplifier means in accordance with said pulse train output frequency signal;

said negative feedback means providing a pulse in response to said output rise and fall time;

means for combining said negative and positive feedback signals to provide a combined feedback signal;

means for applying said combined feedback signal to said amplifier means to control said output rise and fall time in accordance with said combined feedback signal.

2. The compensation circuit according to claim 1, wherein said negative feedback network is formed by a resistor and capacitor high pass filter network and said positive feedback network is formed by a resistor and capacitor low pass ladder type phase shift network.

3. The compensation circuit according to claim 1, wherein said negative feedback network is formed by a resistor and capacitor high pass filter network and said positive feedback network is formed by a half Wien bridge network.

4. The compensation circuit according to claim 1 which is further temperature stabilized, wherein said amplifier means is constructed using Field Effect Transistors.

5. A compensation circuit for stabilizing the frequency of a CMOS oscillator comprising:

CMOS amplifier means, including a non-linear amplifying means for providing a pulse train output frequency signal having an output rise and an output fall;

positive feedback means for receiving said output frequency signal and applying a positive feedback signal to said amplifier means in accordance with said output frequency signal;

negative feedback means for receiving said pulse train output frequency signal and providing a negative feedback signal to said amplifier means in accordance with said output frequency signal;

said negative feedback means providing a pulse in response to said output rise and fall;

means for combining said negative and positive feedback signals to provide a combined feedback signal;

means for applying said combined feedback signal to said amplifier means to control said output rise and fall in accordance with said combined feedback signal.

6. The compensation circuit according to claim 5, wherein said negative feedback network is formed by a resistor and capacitor high pass filter network and said positive feedback network is formed by a resistor and capacitor low pass ladder type phase shift network.

* * * * *